US006792569B2

(12) United States Patent
Cox et al.

(10) Patent No.: US 6,792,569 B2
(45) Date of Patent: Sep. 14, 2004

(54) ROOT SOLVER AND ASSOCIATED METHOD FOR SOLVING FINITE FIELD POLYNOMIAL EQUATIONS

(75) Inventors: Charles Edwin Cox, San Jose, CA (US); Martin Aureliano Hassner, Palo Alto, CA (US); Barry Marshall Trager, Yorktown Heights, NY (US); Shmuel Winograd, Scarsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 630 days.

(21) Appl. No.: 09/842,244

(22) Filed: Apr. 24, 2001

(65) Prior Publication Data

US 2002/0170018 A1 Nov. 14, 2002

(51) Int. Cl.[7] .............................................. H03M 13/00
(52) U.S. Cl. ..................................................... 714/781
(58) Field of Search ............................. 714/781, 785, 714/784, 794; 375/262, 341

(56) References Cited

U.S. PATENT DOCUMENTS

| | | | |
|---|---|---|---|
| 4,504,948 A | 3/1985 | Patel ........................... | 714/765 |
| 4,875,211 A | 10/1989 | Murai et al. ................. | 714/784 |
| 5,001,715 A | 3/1991 | Weng ........................... | 714/782 |
| 5,377,207 A | 12/1994 | Perlman ....................... | 714/784 |
| 5,428,628 A * | 6/1995 | Hassner et al. ............. | 714/759 |
| 5,436,916 A * | 7/1995 | Nakamura .................... | 714/785 |
| 5,535,140 A | 7/1996 | Iwamura ....................... | 701/99 |
| 5,710,782 A | 1/1998 | Weng ........................... | 714/785 |
| 5,737,343 A | 4/1998 | Meyer .......................... | 714/784 |
| 5,768,296 A | 6/1998 | Langer et al. ............. | 371/37.11 |
| 5,771,246 A | 6/1998 | Weng ........................... | 714/762 |
| 5,805,617 A | 9/1998 | Im ................................. | 714/785 |
| 5,818,854 A | 10/1998 | Meyer .......................... | 714/785 |
| 5,942,005 A | 8/1999 | Hassner ....................... | 714/784 |
| 5,946,328 A | 8/1999 | Cox et al. ................... | 714/784 |
| 6,671,850 B1 * | 12/2003 | Cox et al. ................... | 714/781 |

OTHER PUBLICATIONS

D.S. Dummit, Solving Solvable QUintics, 1991, Google.com p. 1 to 17.*
"Implementation of Reed Solomon Codes over Symbols of Size 16 Bits—Method and Apparatus," IBM Technical Disclosure Bulletin, vol. 37, No. 02A, Feb. 1994.
"Fast Double Error Correction," IBM Technical Disclosure Bulletin, vol. 25, No. 5, Oct. 1982.
D.S. Dummit, "Solving Solvable Quintics," Mathematics of Computation, vol. 57, No. 195, Jul. 1991, pp. 387–401.
"Logic and Software Engineering," International Workshop in Honor of Chih–Sung Tang, Aug. 14–15, 1995.

(List continued on next page.)

*Primary Examiner*—Albert Decady
*Assistant Examiner*—Shelly A Chase
(74) *Attorney, Agent, or Firm*—Samuel A. Kassatly

(57) ABSTRACT

An error correction algebraic decoder uses a key equation solver for calculating the roots of finite field polynomial equations of degree up to six, and lends itself to efficient hardware implementation and low latency direction calculation. The decoder generally uses a two-step process. The first step is the conversion of quintic equations into sextic equations, and the second step is the adoption of an invertible Tschirnhausen transformation to reduce the sextic equations by eliminating the degree 5 term. The application of the Tschirnhausen transformation considerably decreases the complexity of the operations required in the transformation of the polynomial equation into a matrix. The second step defines a specific Gaussian elimination that separates the problem of solving quintic and sextic polynomial equations into a simpler problem of finding roots of a quadratic equation and a quartic equation.

13 Claims, 9 Drawing Sheets

OTHER PUBLICATIONS

"Convenient Roots for a Reed Solomon Code," IBM Technical Disclosure Bulletin, vol. 27, No. 2, Jul. 1984.

Carl Bender et al., "Quasi–Exactly Solvable Quartic Potential," Journal of Physics A Mathematical and General, vol. 31, No. 14, Apr. 10, 1998, pp. L273–L277.

Lu Yang, et al. "A Distinctive Algorithm for Determining the Number of Real Roots of a Polynomial," Laboratory for Automated Reasoning & Programming, Chengdu Institute of Computer Applications, Academia Sinica (no publication date available).

Martin Hassner et al. "Root Finding Algorithms for GF(2) Polynomial Equations of Degree up to 4," IBM Techical Disclosure Bulletin, vol. 34, No. 4B, Sep. 1991, pp. 93–97.

* cited by examiner

ROOT SOLVER AND ASSOCIATED METHOD FOR SOLVING FINITE FIELD POLYNOMIAL EQUATIONS

FIELD OF THE INVENTION

The present invention relates to the field of data storage, and particularly to systems and methods employing a error correction algebraic decoder. More specifically, the present invention describes a key equation solver that calculates the roots of finite field polynomial equations of degree up to six, which lends itself to efficient hardware implementation and low latency direction calculation.

BACKGROUND OF THE INVENTION

The use of cyclic error correcting codes in connection with the storage of data in storage devices is well established and is generally recognized as a reliability requirement for the storage system. Generally, the error correcting process involves the processing of syndrome bytes to determine the location and value of each error. Non-zero syndrome bytes result from the exclusive-ORing of error characters that are generated when data is written on the storage medium.

The number of error correction code (ECC) check characters employed depends on the desired power of the code. As an example, in many present day ECC systems used in connection with the storage of 8-bit bytes in a storage device, two check bytes are used for each error to be corrected in a codeword having a length of at most 255 byte positions. Thus, for example, six check bytes are required to correct up to three errors in a block of data having 249 data bytes and six check bytes. Six distinctive syndrome bytes are therefore generated in such a system. If there are no errors in the data word comprising the 255 bytes read from the storage device, then the six syndrome bytes are the all zero pattern. Under such a condition, no syndrome processing is required and the data word may be sent to the central processing unit. However, if one or more of the syndrome bytes are non-zero, then syndrome processing involves the process of identifying the location of the bytes in error and further identifying the error pattern for each error location.

The underlying mathematical concepts and operations involved in normal syndrome processing operations have been described in various publications. These operations and mathematical explanations generally involve first identifying the location of the errors by use of what has been referred to as the "error locator polynomial". The overall objective of the mathematics involved employing the error locator polynomial is to define the locations of the bytes in error by using only the syndrome bytes that are generated in the system.

The error locator polynomial has been conventionally employed as the start of the mathematical analysis to express error locations in terms of syndromes, so that binary logic may be employed to decode the syndrome bytes into first identifying the locations in error, in order to enable the associated hardware to identify the error patterns in each location. Moreover, error locations in an on-the-fly ECC used in storage or communication systems are calculated as roots of the error locator polynomial.

Several decoding techniques have been used to improve the decoding performance. One such technique is minimum distance decoding whose error correcting capability relies only upon algebraic redundancy of the code. However, the minimum distance decoding determines a code word closest to a received word on the basis of the algebraic property of the code, and the error probability of each digit of the received word does not attribute to the decoding. That is, the error probability of respective digits are all regarded as equal, and the decoding becomes erroneous when the number of error bits exceeds a value allowed by the error correcting capability which depends on the code distance.

Another more effective decoding technique is the maximum likelihood decoding according to which the probabilities of code words regarded to have been transmitted are calculated using the error probability of each bit, and a code word with the maximum probability is delivered as the result of decoding. This maximum likelihood decoding permits the correction of errors exceeding in number the error correcting capability. However, the maximum likelihood decoding technique is quite complex and requires significant resources to implement. In addition, the implementation of the maximum likelihood decoding technique typically disregards valuable data such as bit reliability information.

However, in conventional decoding schemes the Reed Solomon code is not optimized to create the maximum number of erasures for given reliability/parity information, mainly due to the fact that such information is largely unavailable to the Reed Solomon decoder. Furthermore, the key equation solvers implemented in conventional decoders are not designed to solve a weighted rational interpolation problem.

Thus, there is still a need for a decoding method that reduces the complexity and resulting latency of the likelihood decoding technique, without significantly affecting its performance, and without losing bit reliability information.

Attempts to render the decoding process more efficient have been proposed. Reference is made to N. Kamiya, "On Acceptance Criterion for Efficient Successive Errors-and-Erasures Decoding of Reed-Solomon and BCH Codes," IEEE Transactions on Information Theory, Vol. 43, No. 5, September 1997, pages 1477 –1488. However, such attempts generally require multiple recursions to calculate the error locator and evaluator polynomials, thus requiring redundancy in valuable storage space. In addition, such attempts typically include a key equation solver whose function is limited to finite field arithmetic, thus requiring a separate module to perform finite precision real arithmetic, which increases the implementation cost of the decoding process.

In addition, the decoder of a linear cyclic error correction code, specifically for Reed-Solomon Error correcting code, calculates the error locator polynomial from the syndromes by using an iterative algorithm called the key equation solver. Once the error locator polynomial coefficients have been calculated, the roots of this polynomial, which are the error locations, need to be found.

The subject of this invention addresses the process of finding the roots of such a polynomial equation. Generally, a simple procedure known as Chien search, which is an iterative search over all possible finite field elements, can be used. The problem associated with this solution is the resulting latency which is as long as the number of codeword symbols. Though it might be possible to speed up the search by conducting several parallel searches, this solution will require the storage of as many copies of the polynomial coefficients as parallel searches used, as well as employing as many sets of constant multipliers as the number of searches used. This would necessitate excessive use of hardware.

There is thus a need for a method by which roots of finite field polynomial equations can be computed in a direct, non-iterative manner. This method becomes increasingly more complicated when used to solve, in a direct manner, polynomial equations of degree higher than four. As an example, a method of linearizing the algebraic problem and solving for the roots by using Gaussian elimination, converts the polynomial into a matrix and reduces the Gaussian elimination to an efficient circuit implementation. The transformations required to reduce the polynomial to a matrix become increasingly complex as the degree of the polynomial of the equation to be solved increases. Furthermore, the processing of the solutions of the Gaussian elimination required to reduce them to the roots of the original polynomial equation become increasingly complex as the degree of the original polynomial increases. Reference is also made to U.S. Pat. No. 6,154,868 to Cox, et al., titled "Method and Means for Computationally Efficient On-The-Fly Error Correction in Linear Cyclic Codes Using Ultra-Fast Error Location," which is assigned to the same assignee as the present invention, and which is incorporated herein by reference, and to Hassner et al., "Root Finding Algorithms for GF(2-8) Polynomial Equations of Degree up to 4," IBM Technical Disclosure Bulletin, Vol. 34, No. 4B, September 1991.

There is thus a further need to simplify the calculations involved in the transformation of the polynomial to a matrix as well as to introduce a simplifying structure into the set of Gaussian elimination solutions.

SUMMARY OF THE INVENTION

In accordance with the present invention, an error correction algebraic decoder and an associated algebraic algorithm that use a key equation solver for calculating the roots of finite field polynomial equations of degree up to six, which lends itself to efficient hardware implementation and low latency direction calculation.

The key equation solver generally uses a two-step process. The first step is the conversion of quintic equations into sextic equations, and the second step is the adoption of an invertible Tschirnhausen transformation to reduce the sextic equations by eliminating the degree 5 term. The application of the Tschirnhausen transformation considerably decreases the complexity of the operations required in the transformation of the polynomial equation into a matrix.

The second step represents an algorithm that defines a specific Gaussian elimination problem, such that an arbitrary solution of this elimination leads to the splitting of the problem of solving quintic and sextic polynomial equations into a problem of finding roots of a quadratic equation and a quartic equation.

BRIEF DESCRIPTION OF THE DRAWINGS

The various features of the present invention and the manner of attaining them will be described in greater detail with reference to the following description, claims, and drawings, wherein reference numerals are reused, where appropriate, to indicate a correspondence between the referenced items, and wherein:

DETAILED DESCRIPTION OF PREFERRED EMBODIMENTS

Figure 1:
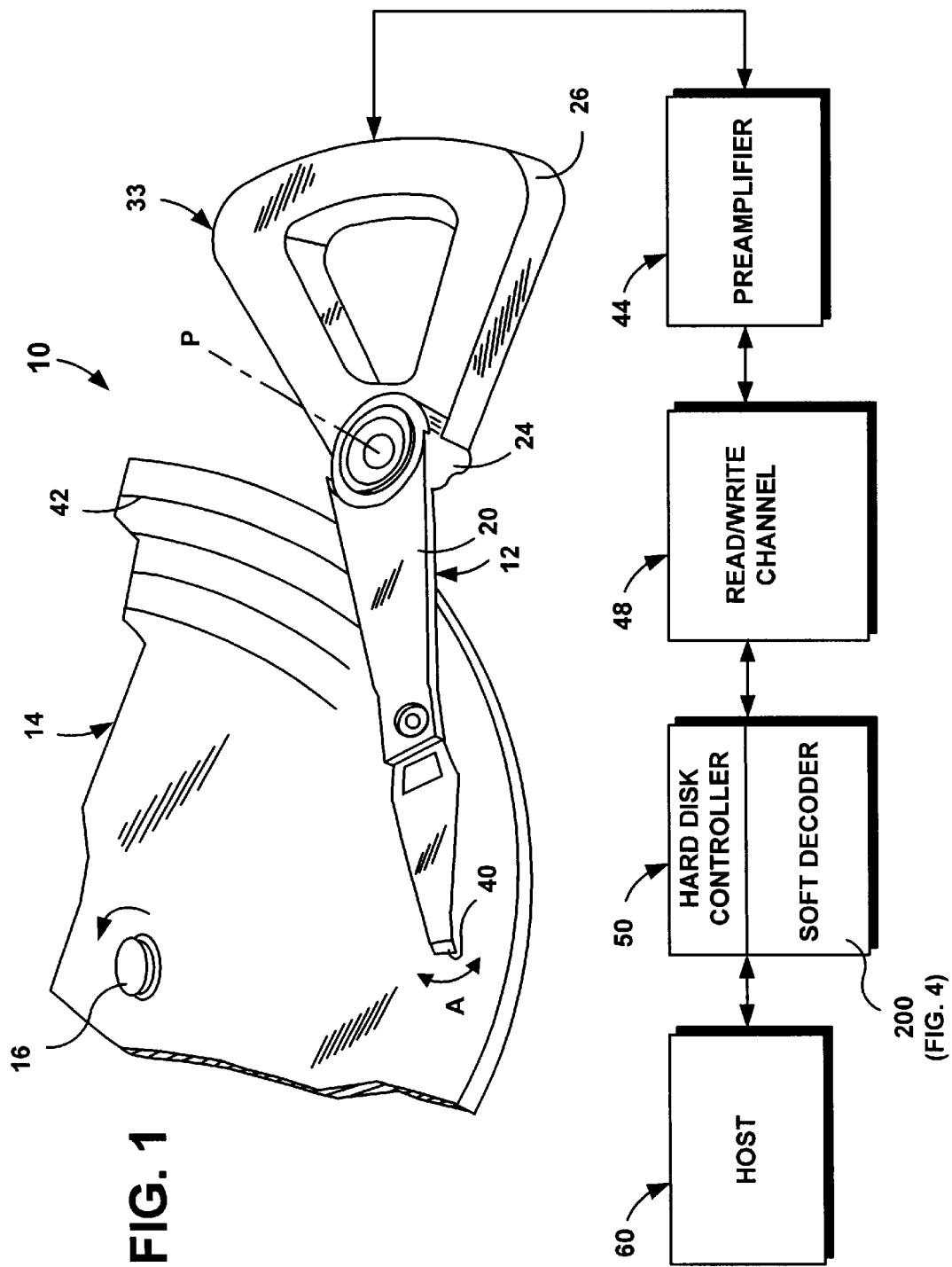
FIG. 1 is a schematic illustration of a data storage system such as a disk drive, that implements an on-the-fly algebraic error correction code (ECC) according to the present invention.

FIG. 1 illustrates a disk drive 10 comprised of a head stack assembly 12 and a stack of spaced apart magnetic, optical and/or MO data storage disks or media 14 that are rotatable about a common shaft 16. The head stack assembly 12 includes a number of actuator arms 20 that extend into spacings between the disks 14, with only one disk 14 and one actuator arm 20 being illustrated for simplicity of illustration. The disk drive 10 further includes a preamplifier 44, a read/write channel 48 that includes a byte reliability generator 49, and a hard disk controller 50 that includes an error correction algebraic decoder 200 of the present invention.

The head stack assembly 12 also includes an E-shaped block 24 and a magnetic rotor 26 attached to the block 24 in a position diametrically opposite to the actuator arms 20. The rotor 26 cooperates with a stator (not shown) for the actuator arms 20 to rotate in a substantially radial direction, along an arcuate path in the direction of an arrow A. Energizing a coil of the rotor 26 with a direct current in one polarity or the reverse polarity causes the head stack assembly 12, including the actuator arms 20, to rotate around axis P in a direction substantially radial to the disks 14. A head disk assembly 33 is comprised of the disks 14 and the head stack assemblies 12.

A transducer head 40 is mounted on the free end of each actuator arm for pivotal movement around axis P. The magnetic rotor 26 controls the movement of the head 40 in a radial direction, in order to position the head 40 in registration with data information tracks or data cylinders 42 to be followed, and to access particular data sectors on these tracks 42.

Numerous tracks 42, each at a specific radial location, are arrayed in a concentric pattern in a magnetic medium of each surface of data disks 14. A data cylinder includes a set of corresponding data information tracks 42 for the data surfaces of the stacked disks 14. Data information tracks 42 include a plurality of segments or data sectors, each containing a predefined size of individual groups of data records that are saved for later retrieval and updates. The data information tracks 42 can be disposed at predetermined positions relative to a servo reference index.

Figure 2:
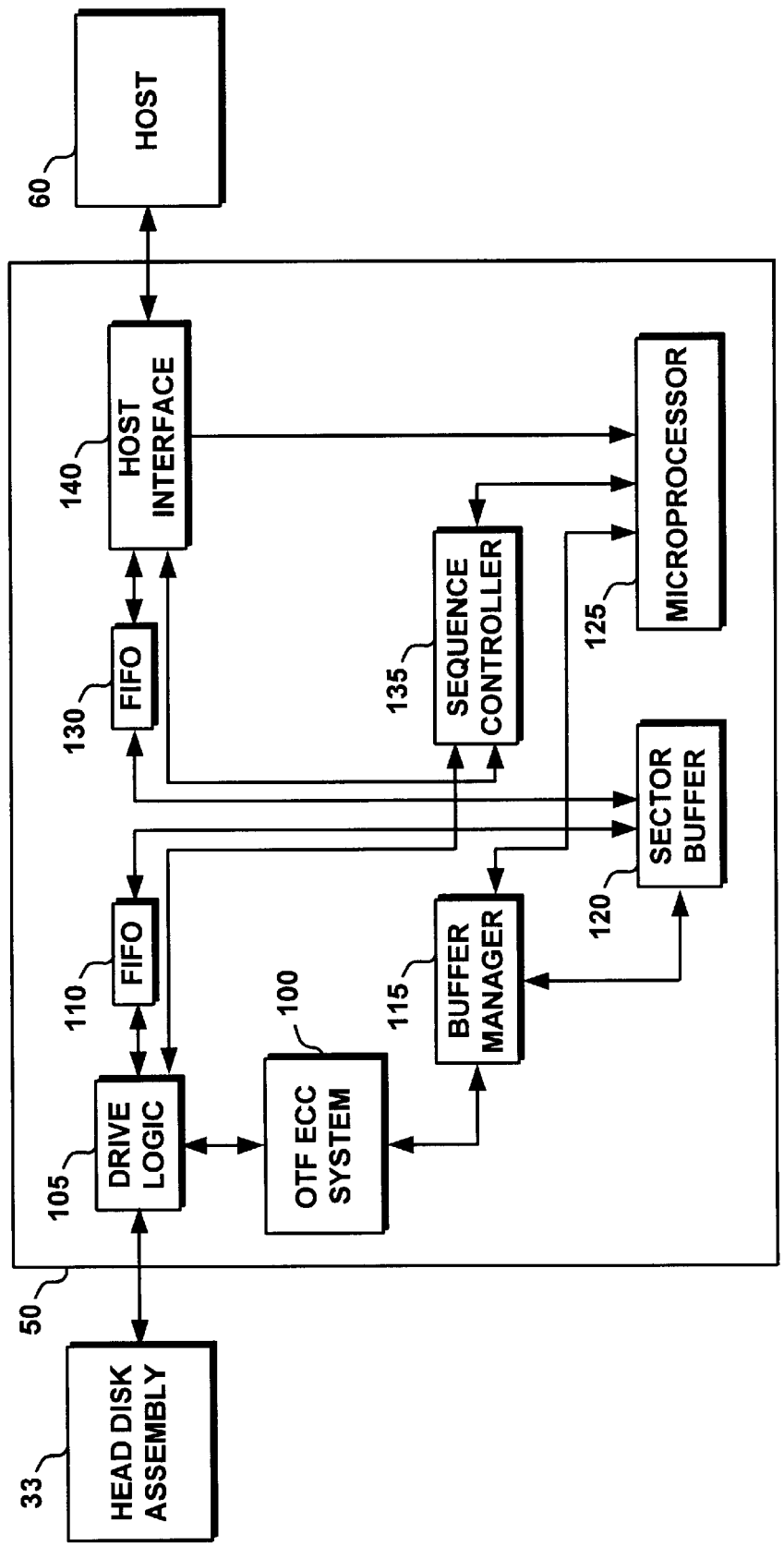
FIG. 2 is a block diagram detailing the architecture of a buffered hard disk controller that includes an on-the-fly (OTF) error correction code (ECC) system for implementing the on-the-fly error correction code according to the present invention.

FIG. 2 illustrates an exemplary architecture of a buffered hard disk controller 50 that comprises an on-the-fly (OTF) error correction code (ECC) system 100 for implementing the on-the-fly error correction code according to the present invention. It should be clear that the present invention is not limited to this specific architecture and that it can be implemented by, or in conjunction with other architectures.

The hard drive controller 50 includes a logic drive circuit 105 that formats data from the hard disk assembly 33, for example from 8 bits to 32 bits. A FIFO register 110 stores the formatted data and exchanges the same with a sector buffer 120. The ECC system 100 receives the formatted data from the drive logic circuit 105 and performs the error correction coding algorithm of the present invention, as described herein.

A buffer manager 115 controls data traffic between the ECC system 100, a sector buffer (i.e., random access memory) 120, and a microprocessor 125. Another FIFO register 130 stores data and exchanges the same with the sector buffer 120. A sequence controller 135 is connected between the drive logic circuit 105, the microprocessor 125, and a host interface 140, to control the sequence operation of the data traffic and various commands across the hard drive controller 50. The host interface 140 provides an interface between the hard drive controller 50 and a host 60 (FIG. 1).

Figure 3:
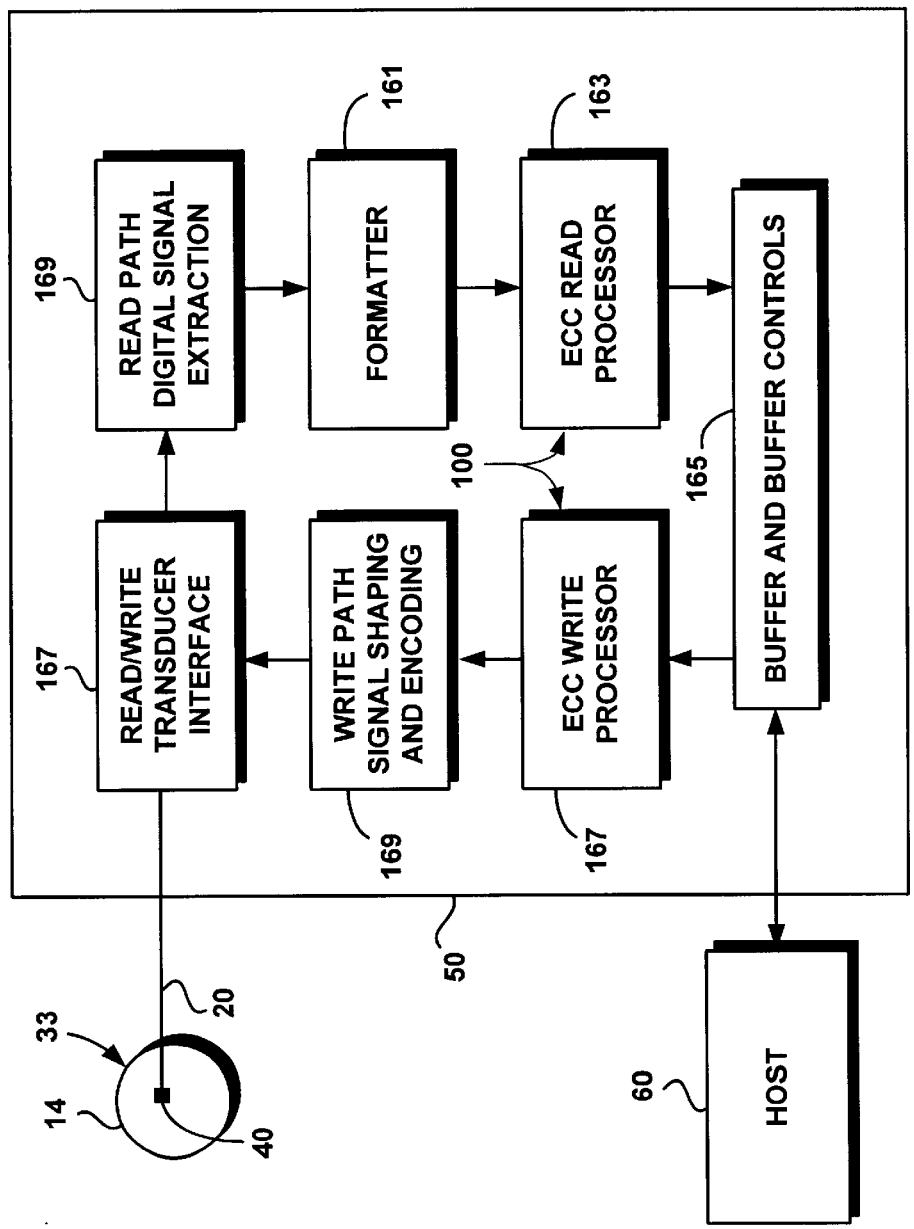
FIG. 3 is a block diagram of the data storage system of FIG. 1, depicting data flow along a read channel and a write channel of the hard drive controller of FIG. 2, and illustrating an exemplary on-the-fly error correction code system comprised of an ECC read processor and an ECC write processor.

FIG. 3 represents a block diagram of the hard disk controller 50 of FIG. 2 that includes an on-the-fly error correction code system 100 comprised of an ECC read processor 163 and an ECC write processor 167. When sequences of digital binary data are to be written onto the disk 14, they are placed temporarily in a buffer 165 and subsequently processed and transduced along a write path or channel (157,167 and 169).

First, a predetermined number of binary data elements, also termed bytes, in a data string are moved from the buffer 165 and streamed through an ECC write processor 167. In the ECC write processor 167, the data bytes are mapped into codewords drawn from a Reed-Solomon code. Next, each codeword is mapped in a write path signal-shaping unit 169 into a run length limited or other bandpass or spectral-shaping code and changed into a time-varying signal. The write path signal-shaping unit 169 includes an encoder 202 (FIG. 4) for encoding the signals as described herein. The time-varying signal is applied through an interface read/write transducer interface 157 and thence to the write element in a magnetoresistive or other suitable transducer head 40 for conversion into magnetic flux patterns.

All the measures starting from the movement of the binary data elements from buffer 165 until the magnetic flux patterns are written on a selected disk track 42 (FIG. 1) as the rotating disk 14 passes under the head 40 are synchronous and streamed. For purposes of efficient data transfer, the data is destaged (written out) or staged (read) a disk sector at a time. Thus, both the mapping of binary data into Reed-Solomon codewords and the conversion to flux producing time-varying signals must be done well within the time interval defining a unit of recording track length moving under the transducer. Typical units of recording track length are equal fixed-length byte sectors of 512 bytes.

When sequences of magnetic flux patterns are to be read from the disk 14, they are processed in a read path or channel (157,159,161, and 163) and written into the buffer 165. The time-varying signals sensed by transducer 40 are passed through the read/write transducer interface 157 to a digital signal extraction unit 159. Here, the signal is detected and a decision is made as to whether it should be resolved as a binary 1 or 0. As these 1's and 0's stream out of the signal extraction unit 159, they are arranged into codewords in the formatting unit 11.

Since the read path is evaluating sequences of Reed Solomon codewords previously recorded on the disk 14, then, absent error or erasure, the codewords should be the same. In order to test whether that is the case, each codeword is applied to an ECC read processor 163 over a path from a formatter 161. Also, the output from the ECC processor 163 is written into buffer 165. The read path also operates in a synchronous datastreaming manner such that any detected errors must be located and corrected within the codeword well in time for the ECC read processor 163 to receive the next codeword read from the disk track 42. The buffer 165 and the read and write channels may be monitored and controlled by the microprocessor 125 (FIG. 2) to ensure efficacy where patterns of referencing may dictate that a path not be taken down, such as sequential read referencing.

Having described the general environment in which the ECC system 100 of the present invention operates, the error correction algebraic decoder (ECC decoder) 200, forming part of the ECC system 100 will now be described. Each of the ECC read processor 163 and the ECC write processor 167 includes an ECC decoder 200 that can be implemented in hardware using digital logic. The main components of the ECC decoder 200 are illustrated in FIG. 4.

Figure 4:
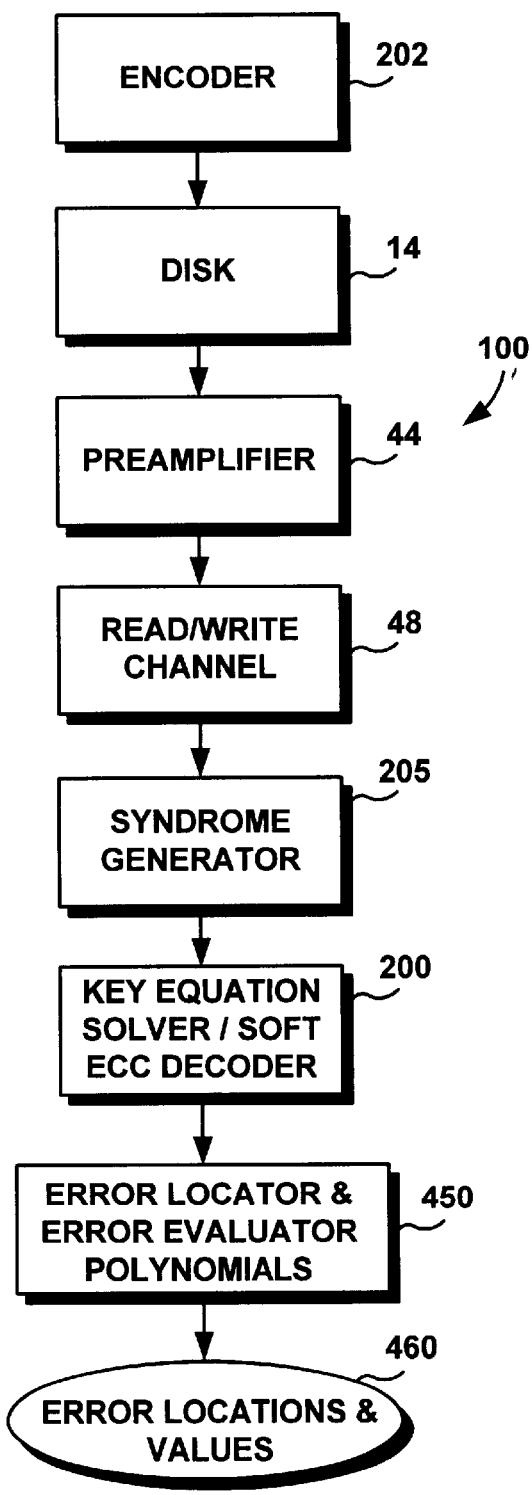
FIG. 4 is a block diagram of the data storage system of FIG. 1, detailing the main components of an error correction code module that forms part of the ECC read processor and the ECC write processor of FIG. 3.

The ECC system 100 of FIG. 4 includes several functional units such as the encoder 202, the preamplifier 44, the read / write channel 48, a syndrome generator 205, and a key equation solver that contains the ECC decoder 200 of the present invention. The syndrome generator 205 generates syndromes 305 (FIG. 5) as is known, or available in the field.

Figure 5:
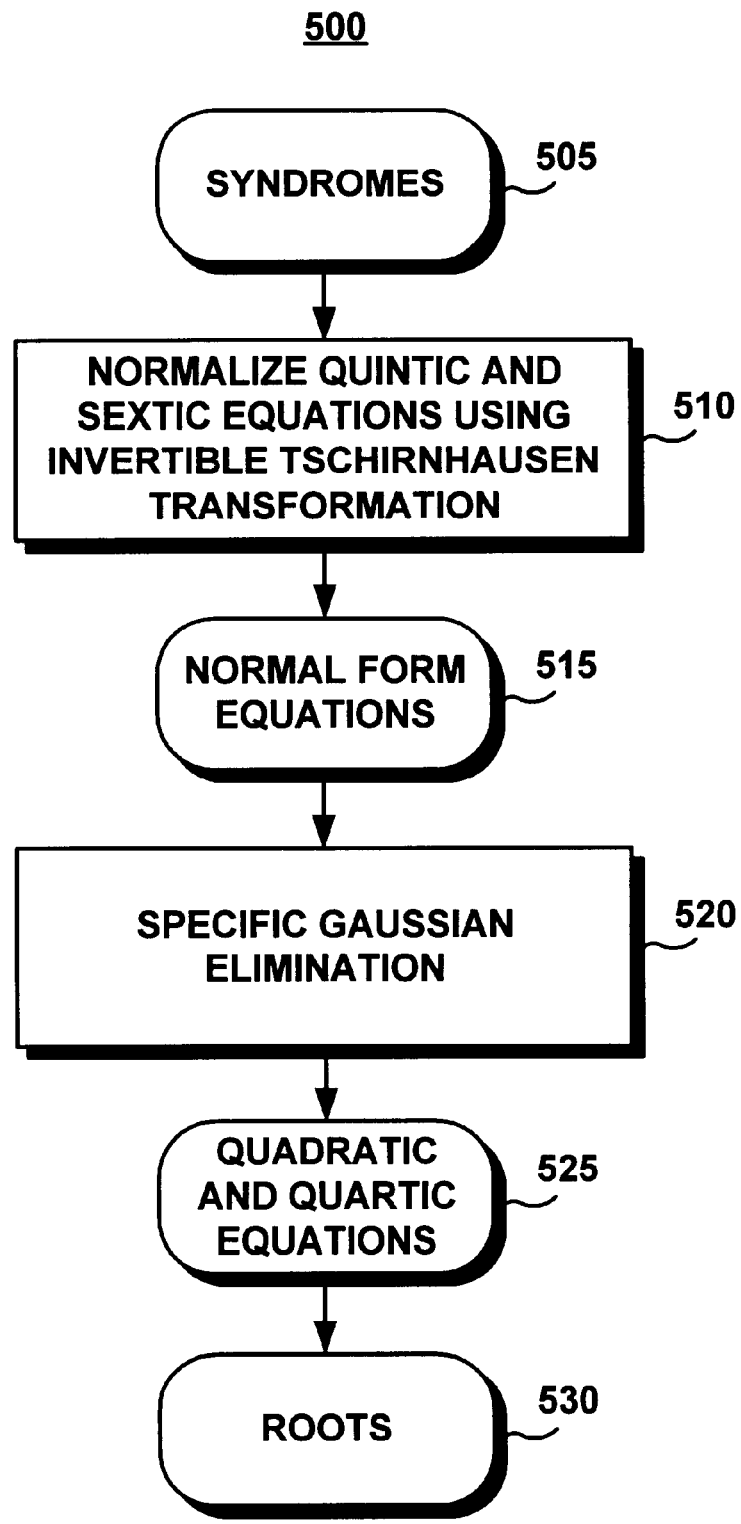
FIG. 5 is a functional flow chart that illustrates a general method for implementing an error correction code by means of a key equation solver that calculates the roots of finite field polynomial equations of degree up to six for use in the data storage system of FIG. 4.
Figure 6A:
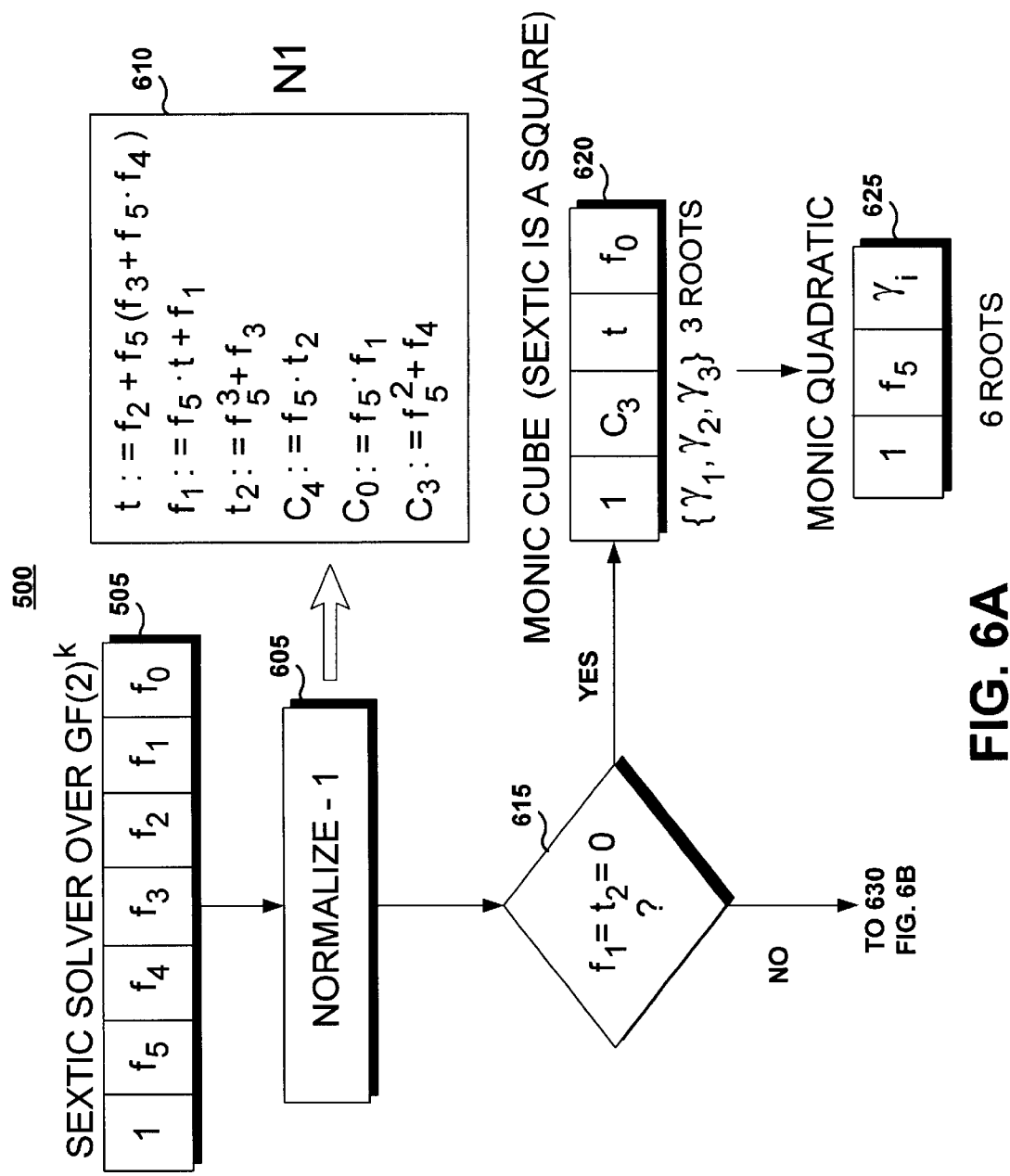
FIG. 6 is comprised of FIGS. 6A, 6B, 6C, and 6D, and represents a functional flow chart of a specific example of the error correction code method of FIG. 5.
Figure 6B:
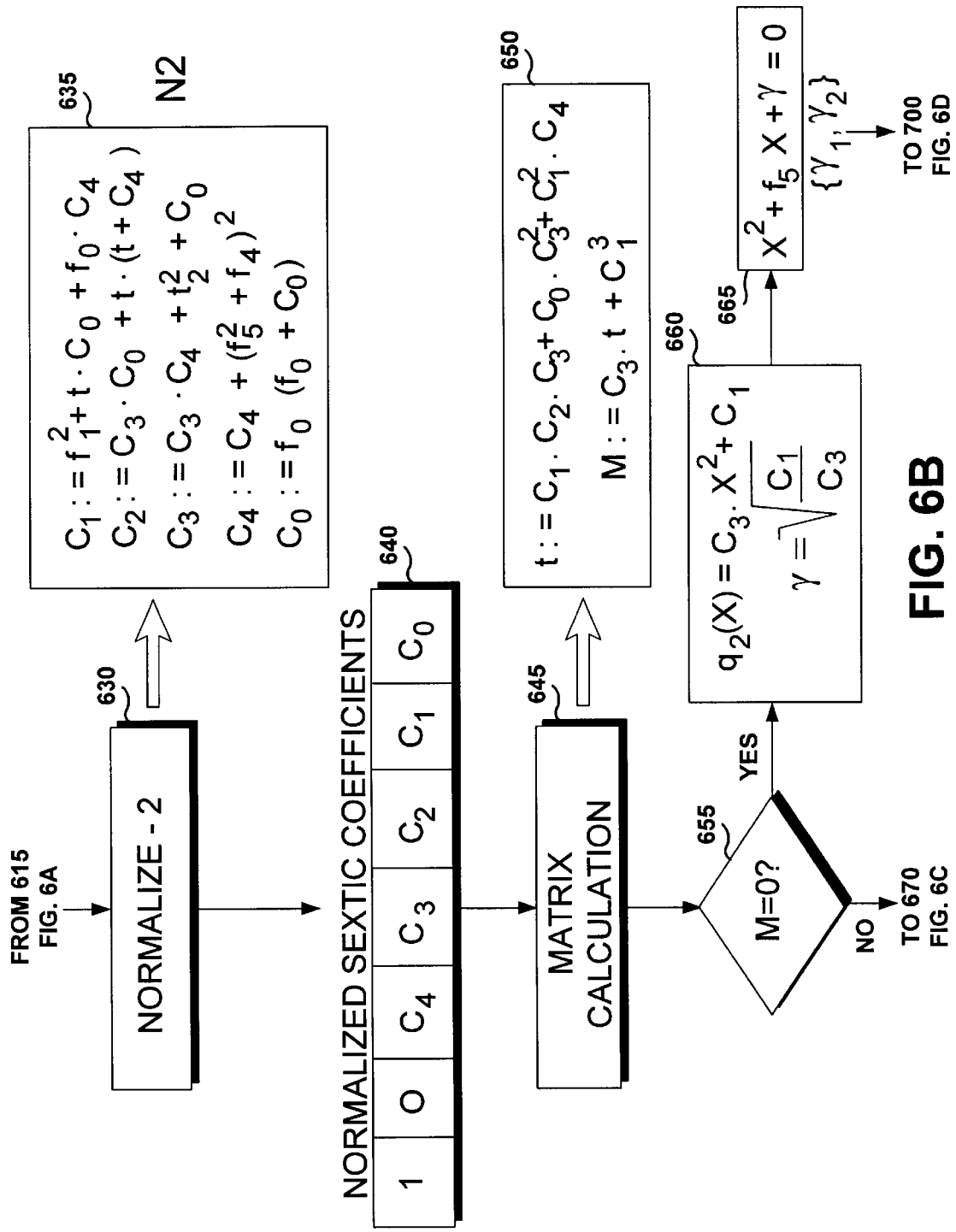
Figure 6C:
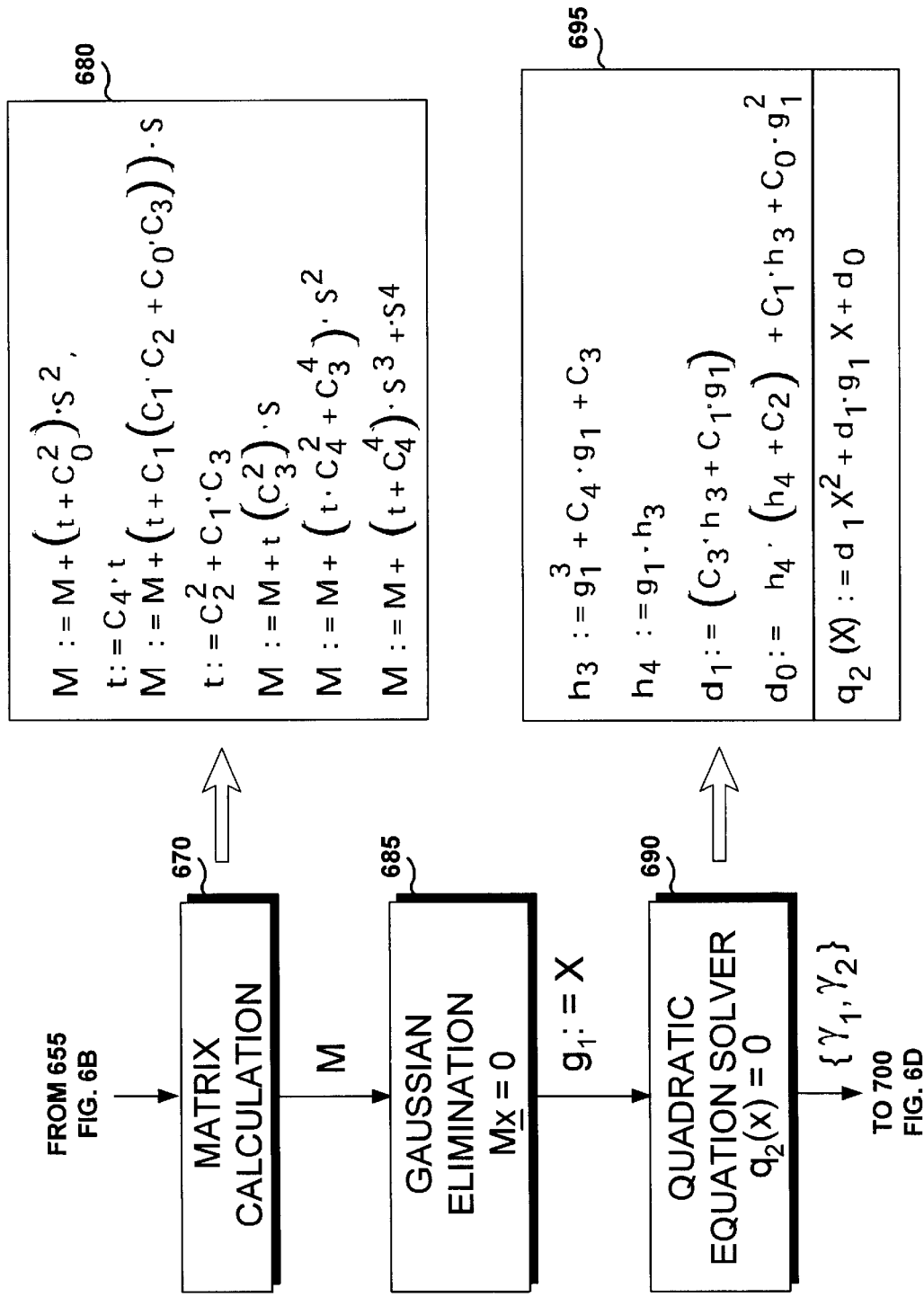
Figure 6D:
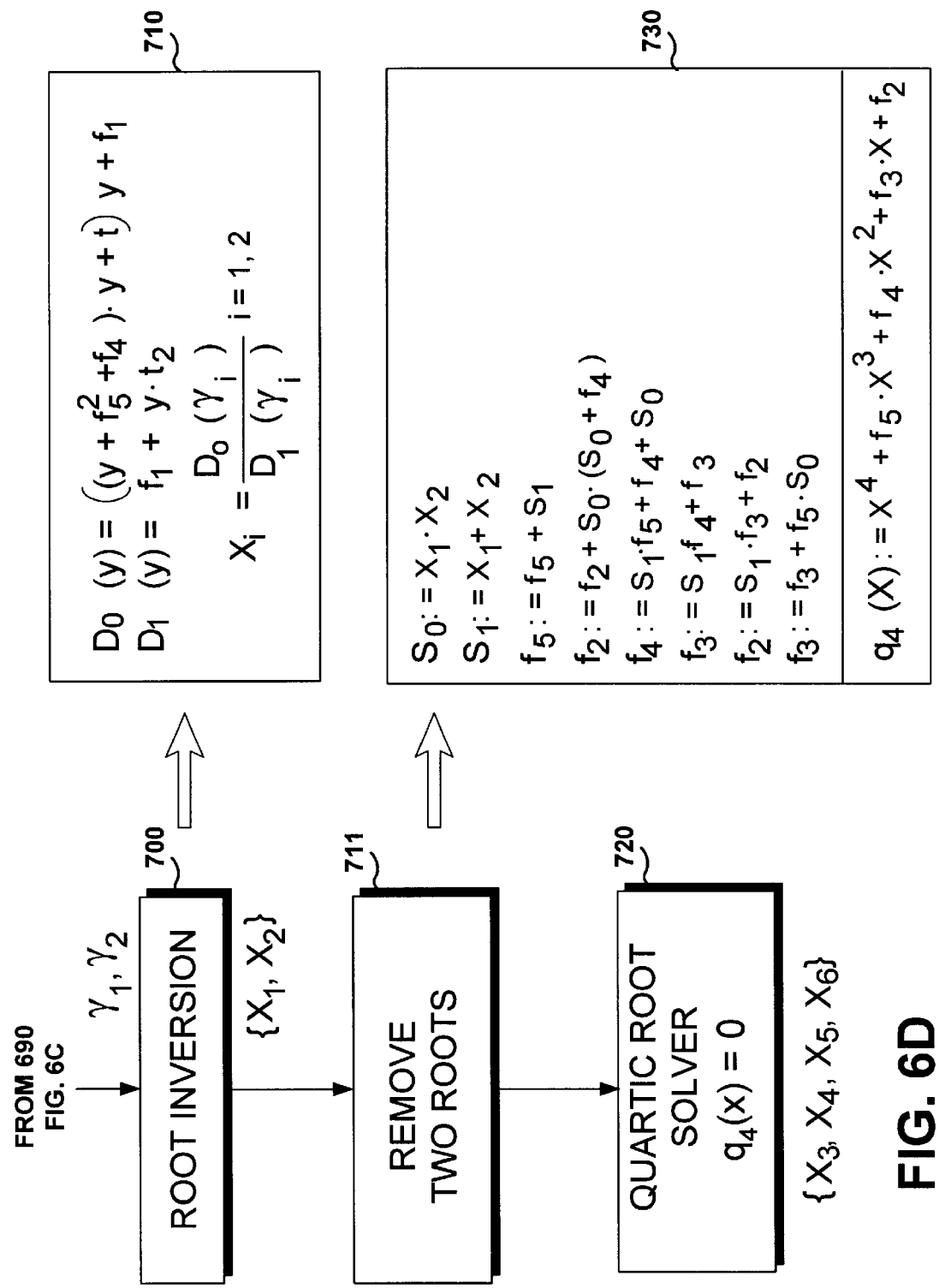

As it will be detailed more fully in FIGS. 5 and 6, the ECC decoder 200 uses a two-step process to calculate the roots of finite field polynomial equations of degree up to six and to generate error locator and evaluator polynomials 450. In turn, the error locator and evaluator polynomials 450 are solved to generate the error locations and values 460 as described, for example, in U.S. Pat. No. 5,428,628 to Hassner et al., which is assigned to the same assignee as the present invention, and which is incorporated herein by reference.

The operation of the ECC decoder 200 will now be described in detail in connection with FIGS. 5 and 6 in view of a specific example, for the purpose of illustration and not limitation. Referring now to FIG. 5, the decoding method 500 receives the syndromes 505 and adopts, at step 510, an invertible Tschirnhausen transformation to reduce the sextic equations by eliminating the degree 5 term. The application of the Tschirnhausen transformation considerably decreases the complexity of the operations required in the transformation of the polynomial equation into a matrix. The normalized equations are illustrated by block 515.

The method 500 then defines a specific Gaussian elimination at step 520, such that an arbitrary solution of this elimination leads to the splitting of the problem of solving quintic and sextic polynomial equations into a problem of finding roots of quadratic equation and quartic equations 530.

Referring now to FIG. 6, the method 500 of FIG. 5 will be described in more detail. The syndrome generator 205 of FIG. 4 generates a sextic error locator polynomial 505 with coefficients $\{1, f_5, f_4, f_3, f_2, f_1, f_0\}$, as follows:

$$X^6 + f_5 \cdot X^5 + f_4 \cdot X^4 + f_3 \cdot X^3 + f_2 \cdot X^2 + f_1 \cdot X + f_0 = 0.$$

It is an object of the key equation solver 450 of FIG. 4 to determine the roots of this sextic polynomial according to the teaching of the present invention.

The method 500 performs a normalization process at steps 510 (FIG. 5) which is illustrated by steps 605 through 640 in FIG. 6. The purpose of the normalization process is to transform the error locator polynomial 505 to eliminate one or more of the coefficients 1, f5, f4, f3, f2, f1, f0. In the example illustrated in FIG. 6, coefficient f5 is eliminated.

At step 615, the method 500 carries out a first normalization step by transforming the coefficients 1, f5, f4, f3, f2, f1, f0 and calculating a new set of coefficients {N1} 610, as follows:

$$t := f_2 + f_5(f_3 + f_5 \cdot f_4)$$

$$f_1 := f_5 \cdot t + f_1$$

$$t_2 := f_5^3 + f_3$$

$$C_4 := f_5 \cdot t_2$$

$$C_0 := f_5 \cdot f_1$$

$$C_3 := f_5^2 + f_4$$

At step 615, the method 500 checks for degenerative situations, that it is checks whether the error locator polynomial 505 is a square of a cubic polynomial, in which event the sextic error locator polynomial 505 will have three rather than six roots, significantly reducing the complexity of the solution. To this end, the method 500 checks for the equality of two of the transformed coefficients (i.e., f1 and t2) to zero.

If such equality is confirmed at decision step 615, the existence of degenerative situations is validated, and the method 500 defines three monic quadratic equations 620 with three roots $\{\gamma_1, \gamma_2, \gamma_3\}$, from which the six roots 625 of the sextic error locator polynomial 505 could be derived.

Returning now to decision step 615, if the method 500 confirms the absence of degenerative situations, it proceeds to step 630 (FIG. 6B) and completes the normalization step 630, and transforms the set of coefficients {N1} into a new set of coefficients {N2} 635, as follows:

$$C_1 := f^2 + t \cdot C_0 + f_0 \cdot C_4$$

$$C_2 := C_3 \cdot C_0 + t \cdot (t + C_4)$$

$$C_3 := C_3 \cdot C_4 = t_2^2 = C_0$$

$$C_4 := C_4 + (f_5^2 + f_4)^2$$

$$C_0 := f_0(f_0 + C_0)$$

This second normalization step 630 results in normalized sextic coefficients 1, 0, C4, C3, C2, C1, C0, eliminating one of the original coefficients (i.e., f5). The normalized coefficients 1, 0, C4, C3, C2, C1, C0 are also denoted by block 515 in FIG. 5.

Having normalized the coefficients, the method 500 proceeds with the specific Gaussian elimination process, as illustrated by steps 645 through 685 in FIG. 6 and step 520 in FIG. 5. At step 645 the method 500 calculates matrices t and M, as indicated by block 650:

$$t := C_1 \cdot C_2 \cdot C_3 + C_0 \cdot C_3^2 + C_1^2 \cdot C_4$$

$$M := C_3 \cdot t + C_1^3$$

The method 500 then proceeds to decision step 655 where it checks the equality of matrix M to zero. If it determines that matrix M is equal to zero, then method 500 confirms the existence of degenerative solutions and the existence of double roots 660 in the form of quadratic equations 665. In this example, method 500 calculates the special roots $\{\gamma_1, \gamma_2\}$ and proceeds to step 700 of FIG. 6D, as it will explained later.

Returning to decision step 655, if method 500 confirms the non equality of matrix M to zero, it proceeds to step 670 where it calculates the matrix M for Gaussian evaluation, as shown in block 680:

$$M := M + (t + C_0^2) \cdot S^2,$$

$$t := C_4 \cdot t$$

$$M := M + (t + C_1(C_1 \cdot C_2 + C_0 \cdot C_3)) \cdot S$$

$$t := C_2^2 + C_1 \cdot C_3$$

$$M := M + t(C_3^2) \cdot S$$

$$M := M + (t \cdot C_4^2 + C_3^4) \cdot S^2$$

$$M := M + t(t + C_4^4) \cdot S^3 + \cdot S^4$$

At step 685, method 500 performs Gaussian elimination with $g_1$, as the solution ($g_1 := X$), as illustrated in block 695, where $q_2(X)$ is a transformed quadratic equation, as follows:

$$h_3 := g_1^3 + C_4 \cdot g_1 + C_3$$

$$h_4 := g_1 \cdot h_3$$

$$d_1 := (C_3 \cdot h_3 + C_1 \cdot g_1)$$

$$d_0 := h_4 \cdot (h_4 + C_2) + C_1 \cdot h_3 + C_0 \cdot g_1^2$$

$$q_2(X) := d_1 X^2 + d_1 \cdot g_1 X + d_0$$

Having determined the quadratic equation $q_2(X)$, method 500 calls upon a quadratic equation solver to calculate the roots $\{\gamma_1, \gamma_2\}$ at step 690. Method 500 then proceeds to step 700 where it inverts the roots $\{\gamma_1, \gamma_2\}$ to generate the roots $\{X_1, X_2\}$ of the original equation (block 505) as illustrated in block 710:

$$D_0(y) = ((y + f_5^2 + f_4) \cdot y + t)y + f_1$$

$$D_1(y) = f_1 + y \cdot t_2$$

$$X_i = \frac{D_0(\gamma_i)}{D_1(\gamma_i)} i = 1, 2$$

Using the roots $\{X_1, X_2\}$, method 500 defines, at step 711 a quartic polynomial, as illustrated in block 730, from the original sextic polynomial by removing the roots $\{X_1, X_2\}$ generated at step 700 (and block 710). Method 500 then resolves the quartic equation at step 720 to obtain the roots $\{X_3, X_4, X_5, X_6\}$ of the polynomial the original sextic polynomial:

$$S_0 := X_1 \cdot X_2$$

$$S_1 := X_1 + X_2$$

$$f_5 := f_5 + S_1$$

$$f_2 := f_2 + S_0 \cdot (S_0 + f_4)$$

$$f_4 := S_1 \cdot f_{5+f_4} + S_0$$

$$f_3 := S_1 \cdot f_4 + f_3$$

$$f_2 := S_1 \cdot f_3 + f_2$$

$$f_3 := f_3 + f_5 \cdot S_0$$

$$q_4(X) := x^4 + f_5 \cdot x^3 + f_4 \cdot x^2 + f_3 \cdot x + f_2$$

It is to be understood that the specific embodiments of the invention that have been described are merely illustrative of certain application of the principle of the present invention. Numerous modifications may be made to the error correcting system and associated method described herein, without departing from the spirit and scope of the present invention. Moreover, while the present invention is described for illustration purpose only in relation to a data storage system, it should be clear that the invention is applicable as well to various communications and data processing systems.

What is claimed is:

1. A programmable multi-level error correction method, comprising:
    transforming a sextic polynomial equation to eliminate a degree 5 term;
    creating a normalized sextic polynomial equation;
    transforming a quintic polynomial equation by eliminating a degree 4 term;
    converting the transformed quintic polynomial equation to a normalized sextic polynomial equation; and
    wherein transforming the sextic polynomial equation includes using a Tschirnhausen transformation.

2. The method of claim 1, wherein the normalized sextic polynomial equation is factored into a quadratic polynomial equation and a quartic polynomial equation.

3. The method of claim 2, further including finding roots for the quadratic and quartic polynomial equations.

4. A programmable multi-level error correction method, comprising:
    normalizing quintic and/or sextic polynomial equations using an invertible Tschirnhausen transformation; and
    defining a specific Gaussian elimination to convert the sextic and/or quintic polynomial equations into a quadratic polynomial equation and a quartic polynomial equation.

5. The method of claim 4, further including finding roots for the quadratic and quartic polynomial equations.

6. The method of claim 5, further including inverting the Tschirnhausen transformation on the roots to produce the roots of the original sextic and/or quintic polynomial equations.

7. A programmable multi-level error correction system, comprising:
    an encoder/decoder that finds roots of a sextic an/or quintic polynomial equation over a finite field by performing Gaussian Elimination on an associated matrix; and
    the encoder/decoders inverts Tschirnhausen transformation on the roots to produce roots of the sextic and/or quintic polynomial equation.

8. The error correction system of claim 7, wherein the encoder/decoders transforms the sextic polynomial equation using a Tschirnhausen transformation.

9. The error correction system of claim 8, wherein a normalized sextic polynomial equation is factored into a quadratic polynomial equation and a quartic polynomial equation.

10. The error correction system of claim 9, wherein the encoder/decoder finds roofs for the quadratic and quartic polynomial equations.

11. A programmable multi-level error correction system, comprising:
    decoding means for performing the following functions:
        converting a quintic polynomial equation into a sextic polynomial equation; and
        transforming the sextic polynomial equation to eliminate a degree 5 term; and
    wherein the decoding means transforms the sextic polynomial equation using a Tschirnhausen transformation.

12. The error correction system of claim 11, wherein a normalized sextic polynomial equation is factored into a quadratic polynomial equation and a quartic polynomial equation.

13. The error correction system of claim 12, wherein the decoding means finds roots for the quadratic and quartic polynomial equations.

* * * * *